US012657366B1

(12) United States Patent
Zhu et al.

(10) Patent No.: US 12,657,366 B1
(45) Date of Patent: Jun. 16, 2026

(54) MULTI-CARD FPGA SYSTEM

(71) Applicant: Amazon Technologies, Inc., Seattle, WA (US)

(72) Inventors: Chen Zhu, Cedar Park, TX (US); Kristopher Ryan King, Austin, TX (US); Chakrapani Saralaya, Leander, TX (US); Kishore Yalamanchili, Leander, TX (US)

(73) Assignee: Amazon Technologies, Inc., Seattle, WA (US)

( * ) Notice: Subject to any disclaimer, the term of this patent is extended or adjusted under 35 U.S.C. 154(b) by 752 days.

(21) Appl. No.: 17/933,571

(22) Filed: Sep. 20, 2022

(51) Int. Cl.
        *G06F 30/343*        (2020.01)
        *G06F 13/10*         (2006.01)
        *G06F 13/28*         (2006.01)
        *H03K 19/17728*      (2020.01)

(52) U.S. Cl.
        CPC .......... *G06F 30/343* (2020.01); *G06F 13/102* (2013.01); *G06F 13/28* (2013.01); *H03K 19/17728* (2013.01); *G06F 2213/28* (2013.01)

(58) Field of Classification Search
        USPC ....................................................... 716/117
        See application file for complete search history.

(56) References Cited

U.S. PATENT DOCUMENTS

| | | | |
|---|---|---|---|
| 5,892,962 A | 4/1999 | Cloutier | |
| 9,934,173 B1 * | 4/2018 | Sakalley | G06F 13/4068 |
| 2005/0256969 A1 | 11/2005 | Yancey et al. | |
| 2017/0195173 A1 | 7/2017 | Izenberg et al. | |

OTHER PUBLICATIONS

U.S. Appl. No. 17/933,575, Zhu et al., filed on Sep. 20, 2022.
U.S. Non-Final Office Action dated Aug. 28, 2025 in U.S. Appl. No. 17/933,575.

* cited by examiner

*Primary Examiner* — Bryce M Aisaka
(74) *Attorney, Agent, or Firm* — Weaver Austin Villeneuve & Sampson LLP

(57) ABSTRACT

An elastic field programmable gate array (FPGA) system may include a plurality of FPGA devices connected in a physical ring topology. Each FPGA device may include a user programmable logic partition and a platform logic partition. The platform logic for each FPGA device can be selected by the client from a plurality of platform logic designs having progressively fewer components. Each platform logic design can include a platform management control block coupled to a microcontroller to implement device management functions and programming of the FPGA device. The size of the user programmable logic partition and the amount of available FPGA resources can vary for each FPGA device based on the platform logic design selected for that FPGA device.

20 Claims, 10 Drawing Sheets

MINIMAL PLATFORM LOGIC
400

MANAGEMENT CONTROL
LOGIC
402

404

700

RECEIVE A GROUP IDENTIFIER TO DEPLOY AN IC DESIGN ON A SET OF FPGA DEVICES COUPLED TO A HOST SYSTEM

902

RETRIEVE A SET OF FPGA IMAGES BASED ON THE GROUP IDENTIFIER

904

PROGRAM THE SET OF FPGA DEVICES WITH THE SET OF FPGA IMAGES

906

MULTI-CARD FPGA SYSTEM

BACKGROUND

A Field Programmable Gate Array (FPGA) device is a hardware device that can be reprogrammed to implement different logic functions. An FPGA device can be partitioned into multiple regions comprising custom logic blocks, standard logic blocks, memory interface blocks, and a system interface to manage the programming of the FPGA device. Some cloud-computing environments can provide FPGA devices in the cloud that can be programmed by a client to implement or test out custom logic designed by the client.

BRIEF DESCRIPTION OF THE DRAWINGS

Various embodiments in accordance with the present disclosure will be described with reference to the drawings, in which.

DETAILED DESCRIPTION

Figure 1:
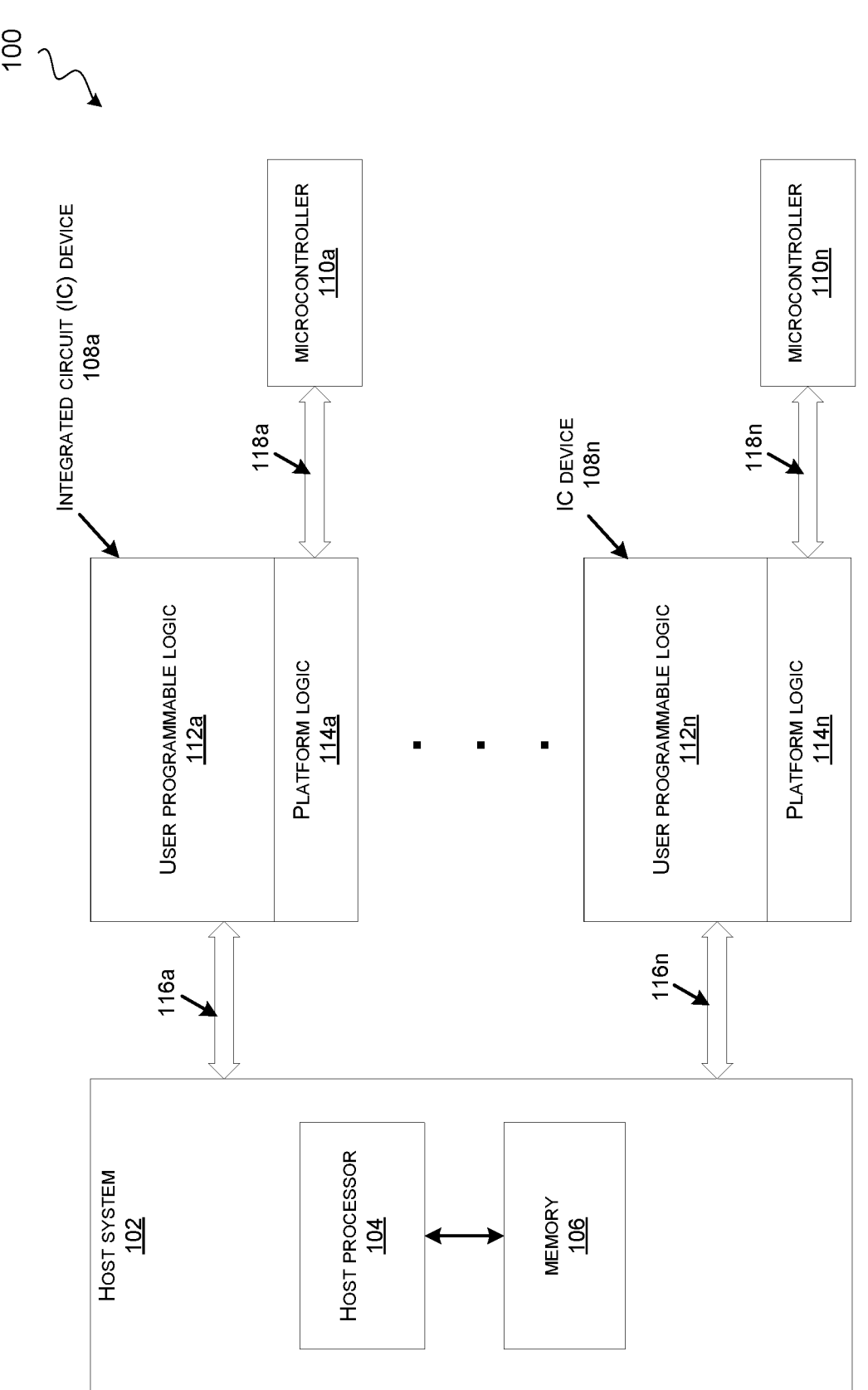
FIG. 1 illustrates a computing system that can be used to deploy a custom integrated circuit (IC) design on a plurality of programmable IC devices, in accordance with some embodiments.

A Field Programmable Gate Array (FPGA) device is a reprogrammable hardware device that can implement different logic functions. In some implementations, the FPGA device is part of a printed circuit board (PCB) or a card that can be used for testing the custom logic. An FPGA device can be generally partitioned into user programmable logic and platform logic. Each FPGA device may also provide processing and storage resources (e.g., co-processors, look up tables, flip-flops, random-access memory, etc.) which can be used by the client. The user programmable logic can be developed, simulated, debugged, and compiled by a user (e.g., client or customer). In some examples, a client can utilize cloud-based FPGA developer tools to develop custom logic (e.g., integrated circuit design) and generate a bitstream that can be deployed on a cloud-based FPGA system to configure or reconfigure FPGA devices in the FPGA system. For example, the FPGA devices can be used to deploy custom hardware accelerators for various applications such as data analytics, image and video processing, network security, and genomics. As an example, a cloud-based server computer may include one or more FPGA cards coupled to a host system to provide custom logic for client applications executing on the host system.

In most implementations, the platform logic in an FPGA device provides support for the configuration/re-configuration of the FPGA device and for the card management using a host interface. The platform logic may include external peripherals, direct memory access (DMA) engine, bus interfaces, interrupts, etc., to provide necessary management services to the platform, and are generally not available to the client. The host interface may be based on a Peripheral Component Interconnect express (PCIe) protocol or another high-speed bus protocol. In most cases, the same host interface is shared to exchange application data and the card management data with the host system.

Generally, the cloud-based FPGA devices can provide a cost-effective solution to the clients by allowing the clients to allocate large amount of computing capacities on the cloud. However, as the integrated circuit (IC) designs grow in size and capacity to support the modern-day applications, the need for deploying large size PFGA devices on the cloud has been increasing. However, deploying a large size FPGA design on a single card may not be the most cost-effective solution for the cloud-service providers. In some cases, the client's IC design may not even fit into the largest available FPGA device on the cloud.

In some cases, a combination of techniques can be used, such as, PCIe switching, Ethernet switching, or Virtual Ethernet, to deploy large IC designs on multiple FPGA cards implemented on different host systems. However, even with these combination of techniques, time-sensitive designs that rely on cycle-accurate simulations and ASIC emulations (e.g., video-processing, networking, and/or machine learning) may still encounter performance penalties due to insufficient bandwidth and/or higher propagation latency when communicating between the host systems.

Generally, a cloud-computing service provider may provide platform logic in each FPGA card to facilitate data exchange with the host system. Such data may include image data for programming the FPGA, management data for status and monitoring of the FPGA device, and application data for the application being implemented by the custom logic. The platform logic tends to be self-contained and may include all the interfaces and logic to facilitate such data exchange between the host system and the user programmable logic. In a multi-card FPGA system, implementing the same platform logic in each FPGA device may not be the optimal solution, because not every FPGA device may need to utilize the full platform logic functions. For example, when the IC design is spread across multiple FPGA devices, only one of the FPGA devices may need to exchange application data with the host system. Since each FPGA device has a fixed amount of logic resources, having each FPGA device programmed with the full platform logic also takes away logic resources that can otherwise be allocated to the client for the custom IC design.

Systems and techniques described herein can provide software and hardware solutions for a client to deploy their custom IC design on a flexible cloud-based FPGA system. The FPGA system may include a plurality of single FPGA cards connected in a physical ring topology through high-speed card-to-card links. The embodiments can provide separate interfaces on each FPGA card to support management functions such as programming the FPGA device. Each FPGA card may include a FPGA device coupled to a microcontroller, which can be used for the platform management as well as configuring/re-configuring of the FPGA device. Each FPGA device may include a user programmable logic partition and a platform logic partition. Different platform logic designs with varying number of components can be provided for programming the platform logic partition. A minimal platform logic design with the smallest number of components may include just a management control interface to communicate with the microcontroller, which can allow the client to use almost the entire FPGA device for the user programmable logic. Other platform logic designs may include additional components such as logic for the host interface to communicate application data with the hosts system. The host interface can be implemented with or without DMA logic. Which of the platform logic design is implemented in which FPGA device can be selected based on the client's custom IC design requirements.

Some embodiments can provide an FPGA developer tool kit that can be used by the client to configure the FPGA system in a way that allows maximum use of the FPGA resources for each FPGA device in the FPGA system. The FPGA developer tool kit can provide the client with a plurality of pre-defined design wrappers, each with a specific platform logic design, and a selection option for card-to-card (C2C) interfaces. The C2C interface can be used for communication between the FPGA devices. The client can logically partition the IC design to fit into two or more FPGA devices in the FPGA system. Embodiments can allow the client to select one of a plurality of platform logic designs for programming the platform logic partition of each of those selected FPGA devices in the FPGA system. The plurality of platform logic designs can provide a different amount of programmable logic remaining in a FPGA device to implement the IC design, as well as the amount of FPGA resources. For example, the size and number of processing and storage resources provided by each FPGA device for the client can vary based on the platform logic design.

In some embodiments, each logic design wrapper may correspond to a specific platform logic design from the plurality of platform logic designs. The plurality of platform logic designs may include a full platform logic design, a mid-platform logic design, and a minimal platform logic design. The full platform logic design may include logic blocks (or circuits) for a host interface, DMA, host interface isolation, and management control. A mid-platform logic design may include logic blocks for a host interface, host interface isolation, and the management control. A minimal platform logic design may include logic blocks for only the management control. The host interface logic block may implement a host interface to communicate and exchange application data with the host system. The DMA logic block may be used to perform DMA accesses with the host system. The isolation logic block may be used to isolate the host interface during programming of the user programmable logic partition. The management control logic block may implement device management functions including programming of the FPGA device.

The client can determine the number of FPGA devices needed to emulate the IC design and map each logic partition of the IC design to one of the FPGA devices. The client can select a logic design wrapper for each logic partition based on the size and functionality of that logic partition. For example, a logic design wrapper with the full platform logic design can be selected for the logic partition that needs to communicate with the host system and needs DMA access with the host. However, if the DMA access is not needed or is implemented within the custom IC design, the mid-platform logic design can be selected to support the host interface. For the logic partitions that do not need to interface with the host system, the client can select the wrapper with the minimal platform logic design in order to maximize the amount of IC design that can be programmed in an FPGA device.

The client can provide the set of logic partitions of the IC design, and a manifest via the developer tool kit. The manifest may include information indicating the number of FPGA devices being used to emulate the IC design, and, for each of the FPGA devices, information indicating a logic design wrapper selected for a logic partition to be implemented in a corresponding FPGA device. The manifest may also include information indicating number of C2C interfaces implemented in each of the FPGA devices. For example, the client may choose to operate the FPGA devices in a chain topology or in a ring topology within the FPGA system. The number of C2C interfaces implemented on a FPGA device may depend on the topology and the location of the FPGA device in the topology.

A set of FPGA images can be generated for the respective FPGA devices to emulate the IC design. Each of the FPGA images may correspond to a logic partition and a platform logic design selected for a respective FPGA device. A group identifier can be assigned to the set of FPGA images. The client can use this group identifier when requesting to deploy their IC design on the FPGA devices using the developer tool kit. The set of FPGA images can be retrieved using the group identifier for programming the FPGA devices via the corresponding microcontrollers. Each FPGA device that is programmed with the IC design can be accessed using a specific device identifier that is mapped to the same group identifier.

Once the FPGA devices have been programmed with the set of FPGA images, the client can use the FPGA devices for testing, debugging, or execution of the client applications running on the host system. The client can modify the IC design as needed to fix bugs or modify features, and access the FPGA system using the group identifier for partial re-configuring of the FPGA devices with the modified IC design. Thus, the embodiments can provide hardware and software solutions for an elastic FPGA system in a multi-card server that can allow optimal use of the FPGA resources by providing an option to mix and match different platform logic designs based upon the connection topology. This flexible architecture can offer more FPGA space and resources to the clients as compared to traditional architectures with fixed platform designs, which can make the timing closures and design routing in the FPGA device much easier for the custom design, and improve the customer experience.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates a computing system 100 that can be used to deploy a custom IC design on a plurality of programmable IC devices, in accordance with some embodiments. The computing system 100 can be part of a compute instance in a cloud-based server that can provide programmable hardware to implement user logic functions. In some examples, computing system 100 can be used to provide custom hardware acceleration for applications in deep learning and inference, image and video processing, network security, genomics, data analytics, or accelerated search, among others.

The computing system 100 may include a host system 102 comprising a host processor 104 and memory 106. The host system 102 may be coupled to N number of programmable IC devices 108a-108n using a peripheral interface. N can be 2, 4, 5, 8, or higher. The programmable IC devices 108a-108n may include an IC device 108a and an IC device 108n. The host device 102 may be coupled to the IC device 108a via a bus interface 116a, and to the IC device 108n via a bus interface 116n. Each of the N IC devices may also be coupled to a respective microcontroller. As shown in FIG. 1, the IC device 108a may be coupled to a microcontroller 110a via a bus interface 118a, and the IC device 108n may be coupled to a microcontroller 110n via a bus interface 118n. The bus interfaces 116a-116n, and 118a-118n may be configured to support any suitable bus protocol, e.g., PCIe.

In some embodiments, the programmable IC devices 108a-108n may include FPGA devices. Each of the FPGA devices and the corresponding microcontroller may be on a separate printed circuit board (PCB) or a separate card (e.g., an FPGA card) coupled to the host system 102 via the peripheral interface. For example, the IC device 108a and the microcontroller 110a may be on a first card, and the IC device 108n and the microcontroller 110n may be on an Nth card. In some examples, the Each of the NIC devices 108a-108n may include a user programmable logic partition, which can be programmed with a portion of the custom IC design, and a platform logic partition, which can be programmed with the platform logic design selected by the client through a developer tool kit.

In some embodiments, the IC devices 108a-108n may be connected in a physical ring topology. For example, each card may be connected to its adjacent cards using respective physical card-to-card (C2C) links. Some embodiments can provide high speed serial transceivers and dedicated C2C traces on the board to directly attach each card to its adjacent cards. The custom IC design on each card can include interface logic based on any suitable bus protocol (e.g., PCIe) to communicate with the adjacent cards using the available hardware. It should be noted that although the IC devices 108a-108n may be physically connected in a ring topology, the FPGA devices can be programmed in a manner to implement either a ring topology or a chain topology by selecting which platform logic design to implement in each FPGA device and selecting the number of C2C links enabled in each FPGA device.

The host processor 104 may be configured to execute instructions stored in the memory 106. For example, the instructions may include instructions to execute one or more client applications on the host processor 104 that interact with the user programmable logic 112a-112n. In various implementations, data associated with the client applications may be stored in the memory 106, and/or in an external memory (not shown). In some embodiments, the memory 106 may also store program code for the developer tool kit that can be executed by the host processor 104 to enable the client to generate the set of binary images for deploying on the IC devices 108a-108n. In other embodiments, the program code for the developer tool kit may be executed on another host system.

Each of the microcontrollers 110a-110n may include a processor that may be configured to execute instructions in an on-chip memory. Each of the microcontrollers 110a-110n may be configured to manage configuration/re-configuration and the platform logic function of the corresponding IC device via the corresponding bus interfaces 118a-118n. In some embodiments, the configuration/re-configuration of each IC device by the corresponding microcontroller may be initiated by the host system 102 in response to a client request.

In some instances, the client's IC design may be too big to fit into a single FPGA device, and, therefore, the client may split up the IC design into a set of logic partitions that can fit into multiple programmable IC devices. The client can partition the IC design based on the system specification, size or functionality of the various platform logic designs, timing and/or area requirements of any intellectual property (IP) blocks, bus protocols, and/or other suitable criteria. In some cases, it would be desirable to maximize the amount of programmable logic available on each FPGA device for the client to implement the IC design in order to minimize the number of FPGA devices needed to emulate the full IC design, which can simplify the design routing and timing closures.

Embodiments can provide a plurality of platform logic designs with progressively reduced number of components so that the client has the option to select appropriate platform logic designs based on the logic partitioning of the IC design. In some embodiments, the client can be provided with an option to select a logic design wrapper for each of the logic partitions of the IC design. Each logic design wrapper may include a platform logic design from the plurality of platform logic designs. The client can also be provided with an option to select, for each of the FPGA devices, a number of C2C interfaces (e.g., FPGA-to-FPGA interfaces) to be implemented. In some embodiments, each wrapper may include information associated with a corresponding floorplan as well as timing constraints that can help simplify the design integration. The developer tool kit may also provide a complete building and verification environment to help the clients simulate the overall design as well as build the final set of FPGA images.

The plurality of platform logic designs may include a full platform logic design, a mid-platform logic design, and a minimal platform logic design. In other implementations, a different number of platform logic designs can be used. The full platform logic design may include a host interface logic block implementing a host interface to communicate with the host system 102, a direct memory access (DMA) logic block to perform DMA access with the host system 102, an isolation logic block to isolate the host interface during programming of the user programmable logic partition, and a management control logic block coupled to a microcontroller to implement device management functions including programming of the IC device. The mid-platform logic design, and the minimal platform logic design may include fewer logic blocks than the full platform logic design. For example, the mid-platform logic design may include the host interface logic block, the isolation logic block, and the management control logic block. The minimal platform logic design may only include the management control logic block. Thus, the full platform logic design and the mid-platform logic design can be used in a single card or multi-card instances, but the minimal platform logic design can be used, for example, only in the multi-card instances because the minimal platform logic design lacks a host interface to communicate with the host system.

The client can select the full platform logic design for an IC device to be programmed with a logic partition of the IC design that needs host interface logic, the isolation logic, and the DMA logic. In cases where a logic partition needs the host interface logic, but doesn't need the DMA logic or has the DMA logic implemented as part of the custom IC design (e.g., to implement a custom DMA engine), the client can select the mid-platform logic design. When a logic partition doesn't need to interface with the host system 102, the client can select the minimal platform logic design with the smallest number of components which can allow the client to maximize the size of the available user programmable logic in that FPGA device.

The client can provide the set of logic partitions of the IC design and a manifest through the developer tool kit. The manifest can be in the form of a text file. The manifest may include information indicating a number of programmable IC devices being used to emulate the IC design, and for each of the programmable devices, information indicating a logic design wrapper selected for a logic partition to be implemented in that IC device. The manifest may also include information that indicates the number of C2C interfaces implemented in each of the IC devices. For example, each IC design can implement zero, one, or two C2C interfaces to connect to the adjacent IC devices. A set of binary images can be generated based on the information in the manifest and the set of logic partitions. Each of the binary images may correspond to a logic partition and a platform logic design selected for a corresponding IC device. A group identifier can be assigned to the set of binary images, and provided to the client via the developer tool. The client can request to deploy the IC design on the IC devices 108a-108n using the group identifier. Each of the IC devices 108a-108n can be assigned a device identifier associated with the group identifier. The client can reference each FPGA device using the individual device identifier.

In some embodiments, the host system 102 can retrieve the set of binary images for a specific custom IC design based on the group identifier, and enable the microcontrollers 110a-110n to program the IC devices 108a-108n with the respective set of binary images. For example, the IC device 108a can be programmed with user programmable logic 112a corresponding to a first logic partition, and platform logic 114a corresponding to the platform logic design selected by the client for the IC device 108a. Similarly, the IC device 108n can be programmed with user programmable logic 112n corresponding to an Nth logic partition, and platform logic 114n corresponding to the platform logic design selected by the client for the IC device 108n. Each of the platform logic 114a-114n can be implemented using one of the full platform logic, mid-platform logic, or the minimal platform logic, as described with reference to FIGS. 2, 3, and 4.

In some embodiments, the set of binary images may be generated on a different host system than the host system used for deploying the IC design. In some embodiments, the IC devices 108a-108n can be used to deploy multiple IC designs associated with one or more clients. As an example, with N equal to 4, two IC devices can be allocated to a first client to deploy a first IC design, and the remaining two IC devices can be allocated to a second client to deploy a second IC design to support multi-tenancy on the host system. In some examples, the first IC design and the second IC design can belong to the same client for different applications. In some examples, even with a multi-card FPGA host system, an IC design may be too large, and may need to be deployed on multiple multi-card host systems. In various implementations, C2C links for data exchange can be paired with other connection solutions such as PCIe peer-to-peer via host CPUs, or virtual Ethernet via built-in network interface of a server, among others to implement the IC design deployed on multiple multi-card host systems.

Figure 2:
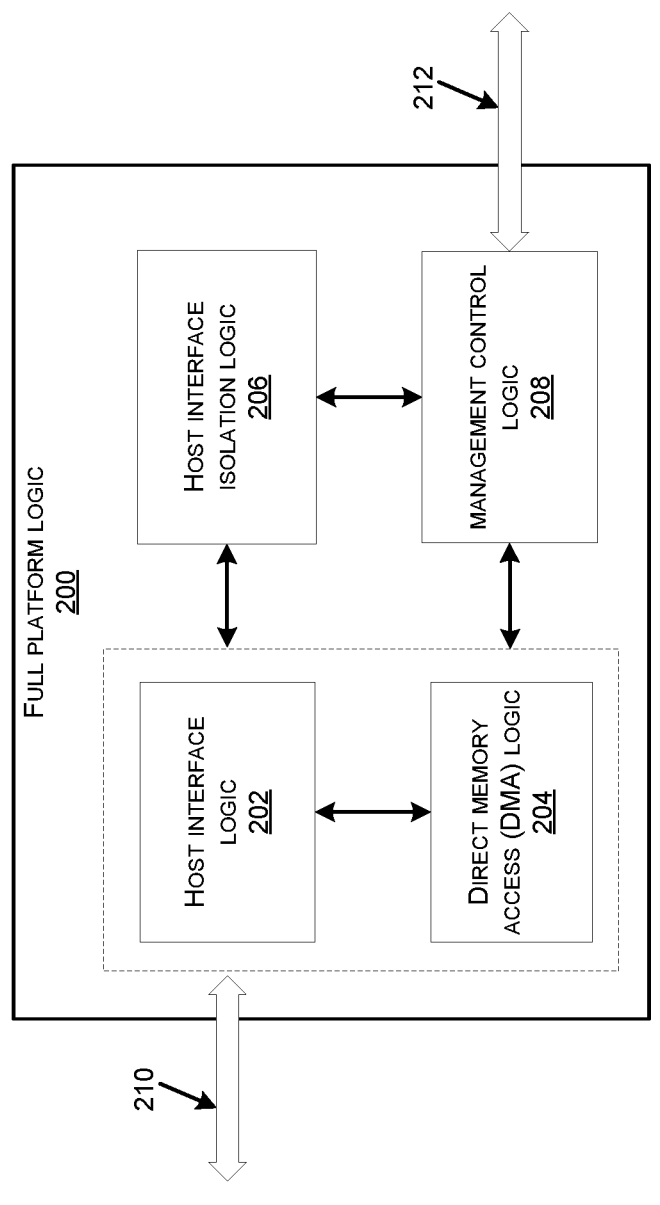
FIG. 2 illustrates example components of a full platform logic block, according to some embodiments.

FIG. 2 illustrates example components of a full platform logic block 200, according to some embodiments. The full platform logic block 200 may include a host interface logic block 202, a DMA logic block 204, a host interface isolation logic block 206, and a management control logic block 208. The full platform logic block 200 may be selected by the client to implement any of the platform logic 114a-114n partitions of the IC devices 108a-108n.

The host interface logic block 202 may include circuitry to provide an interface to communicate with the host processor 104 via a bus interface 210. The bus interface 210 may be one of the bus interfaces 116a-116n. In some examples, the client application executing on the host processor 104 may interact with the given user programmable logic using the host interface logic block 202. For example, the client application may access the host memory to obtain application data or to store application data into the host memory using the host interface logic block 202.

The DMA logic block 204 may include circuitry to facilitate DMA transfers between the host system 102 and the given user programmable logic. The DMA logic block 204 can effectuate data transfers without involving the host processor 104 to offload the memory access operations from the host processor 104. The DMA logic block 204 may include controllers, queues, registers, and/or other suitable logic to support the DMA functionality. The DMA transfers can be configured by the client application.

The host interface isolation logic block 206 may include circuitry to isolate the user programmable logic partition from the platform logic partition of the given IC device when partially configuring the IC device. For example, after deploying the IC design on the IC devices 108a-108n, the client may run tests and debug the design to verify the functionality of the custom logic, or to execute the custom logic. In some cases, the client may change the custom logic to fix bugs or modify the design features, and regenerate the binary images from the modified custom logic. The regenerated binary images can be reloaded into the user programmable logic 112a-112n by partially reconfiguring the IC devices 108a-108n using the updated bitstreams without updating the platform logic. The host interface isolation logic block 206 may be used to disable the interface between the user programmable logic and the platform logic during the partial re-configuration of the given IC device in order to isolate the platform logic. The host interface isolation logic block 206 may also isolate the on-chip FPGA memory and/or the external FPGA memory such that application data stored in these memories are not affected by the re-configuration.

The host interface isolation logic block 206 may also include circuitry to monitor the communication between the user programmable logic and the platform logic and notify the software layer upon detecting any unexpected behavior. For example, in some cases, the platform logic may send a message or data to the user programmable logic, but the user programmable logic may not respond in a timely manner, which can hang the system. To avoid these scenarios, the host interface isolation logic block 206 may include time-out timers to track the response time from the user programmable logic, and generate a notification to the management control logic 208 if the response is not received within a certain time period.

The management control logic block 208 may include circuitry to communicate with the microcontroller for platform management, and for configuring/reconfiguring the full/partial regions of the IC design. In some embodiments, the configuring/reconfiguring of the FPGA device may be initiated by the host processor 104 via the microcontroller. The platform management may include performing health checks, monitoring security, and collecting statistics, among others. In some implementations, the management control logic block 208 may include control and status registers that can be accessed by the software executing on the microcontroller to manage specific management and control functionalities on the IC device, and detect any errors in a timely manner. The management control logic block 208 may also include circuitry to provide a mailbox interface for communication between the host processor 104 and the corresponding microcontroller. For example, the mailbox interface can be used by the host processor 104 for programming the FPGA device on the card via the corresponding microcontroller.

Figure 3:
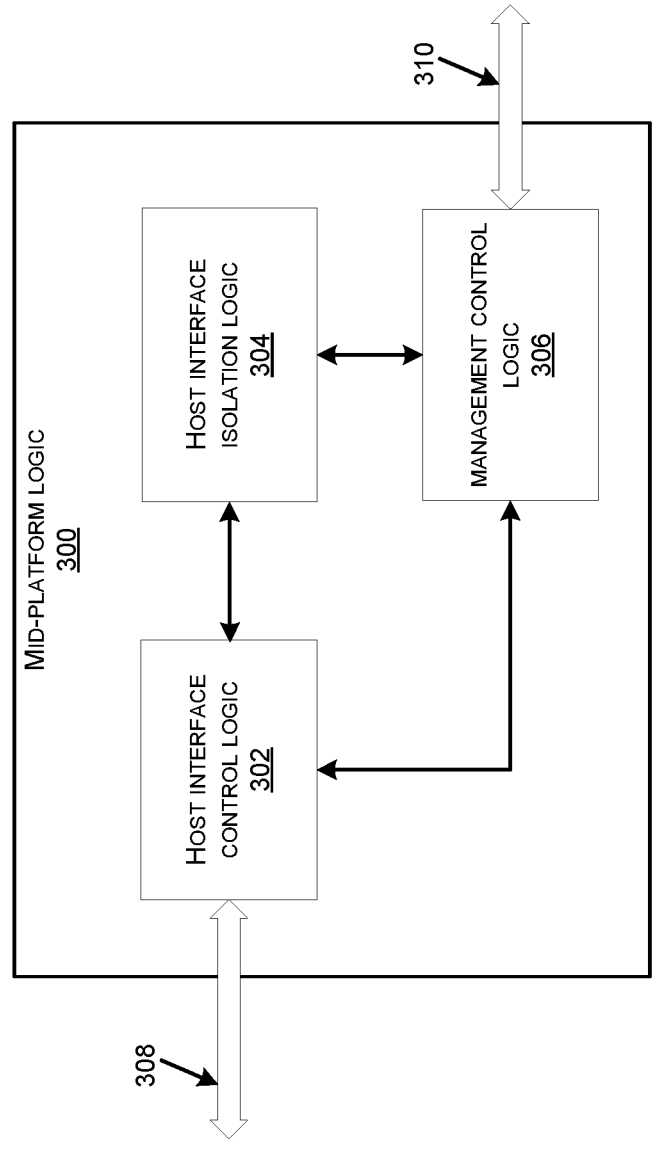
FIG. 3 illustrates example components of a mid-platform logic block, according to some embodiments.

FIG. 3 illustrates example components of a mid-platform logic block 300, according to some embodiments. The mid-platform logic block 300 may include a host interface logic block 302, a host interface isolation logic block 304, and a management control logic block 306. The management control logic block 306 may communicate with the host system 102 using a bus interface 308 and with the microcontroller using a bus interface 310. These components are similar to those described with reference to FIG. 2, and thus a detail description of which need not be repeated.

The mid-platform logic block 300 can be used when the DMA logic is part of the custom logic of the IC design or is not needed. The host interface logic block 302 may be similar to the host interface logic block 202, the host interface isolation logic block 304 may be similar to the host interface isolation logic block 206, and the management control logic block 306 may be similar to the management control logic block 208. The bus interface 308 may be one of the bus interfaces 116a-116n, and the bus interface 310 may be one of the bus interfaces 118a-118n. Thus, the mid-platform logic block 300 may include fewer components than the full platform logic block 200, and, therefore, can provide more FPGA space for the user programmable logic for that FPGA device.

Figure 4:
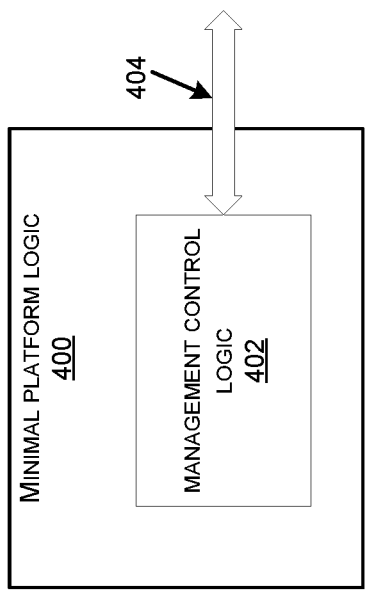
FIG. 4 illustrates example components of a minimal platform logic block, according to some embodiments.

FIG. 4 illustrates example components of a minimal platform logic block 400, in some embodiments. The minimal platform logic block 400 may only include management control logic block 402. The management control logic block 402 may communicate with the microcontroller using a bus interface 404.

The minimal platform logic block 400 may be selected when a logic partition of the IC design does not need to communicate with the host system 102, and, therefore, the host interface is not needed by the user programmable logic. The management control logic block 402 may be similar to the management control logic block 208, and thus a detail description of which need not be repeated. The bus interface 404 may be one of the bus interfaces 118a-118n. The minimal platform logic block 400 may include the smallest number of components as compared to the mid-platform logic block 300, and the full platform logic block 200. The amount of logic resources needed to implement the management control logic block 402 can be only a few percent of the total amount of logic resources available on the FPGA device. Therefore, selecting the minimal platform logic block 400 can allow almost the entire FPGA device to be used for the user programmable logic.

Generally, each FPGA device can provide FPGA resources including logic gates, processing and memory resources, co-processors (e.g., digital signal processors), on-chip memory (e.g., random access memory, look-up tables, flip-flops), and/or external memory interfaces to communicate with an external memory. The number and/or amount of resources available for the client's custom logic in each FPGA device may vary based on the size of the platform logic design selected by the client. For example, the amount of FPGA resources available for the client's custom logic can progressively increase with the selection of full platform logic block 200, mid-platform logic block 300, or the minimal platform logic block 400.

Figure 5:
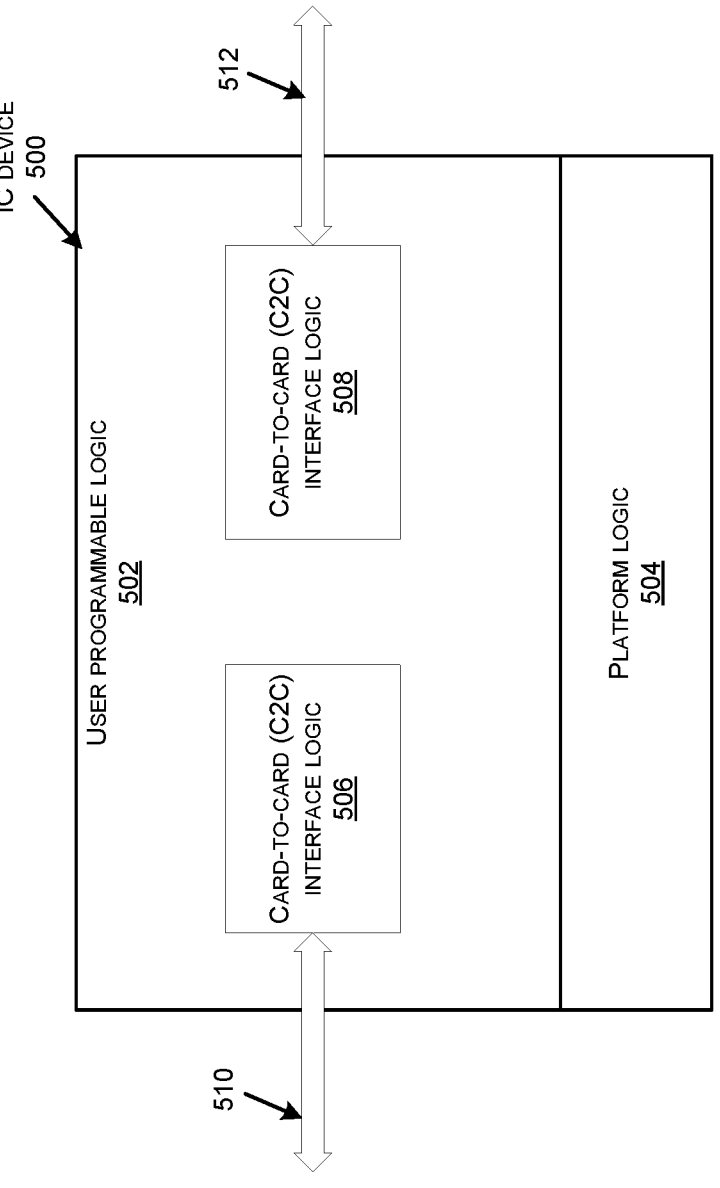
FIG. 5 illustrates card-to-card (C2C) interfaces for an IC device, in some embodiments.

FIG. 5 illustrates card-to-card (C2C) interfaces for an IC device 500, according to some embodiments. The IC device 500 can be one of the IC devices 108a-108n in FIG. 1 that are coupled in a physical ring topology. The IC device 500 may include user programmable logic 502 and platform logic 504.

The user programmable logic 502 can be programmed with one of the logic partitions of the custom logic, as described with reference to FIG. 1. In various embodiments, the user programmable logic 502 may comprise C2C interface logic 506 and/or C2C interface logic 508. The C2C interface logic 506 may be implemented to communicate with an adjacent IC device via a C2C link 510, and the C2C interface logic 508 may be implemented to communicate with another adjacent IC device via a C2C link 512. The client can select to use one or both of the C2C links 510 and 512 based on the number of IC devices used for emulating the IC design and/or the topology the client selects for coupling the FPGA devices. As discussed previously with reference to FIG. 1, the client can provide information about the number of C2C links in the manifest for each of the IC devices that were selected by the client. The platform logic 504 can be implemented using the full platform logic 200, the mid-platform logic 300, or the minimal platform logic 400.

In some embodiments, each card in the FPGA system may include high speed serial transceivers and dedicated C2C traces on the board to directly attach each card to its adjacent cards. The C2C interface logic 506 and the C2C interface logic 508 can include circuitry to implement any suitable bus protocol for communicating with the adjacent cards via the C2C links 510 and 512, respectively, using the available hardware on the card. The C2C links 510 and 512 can be implemented using any suitable bus protocol, e.g., PCIe, Aurora, etc.

Figure 6:
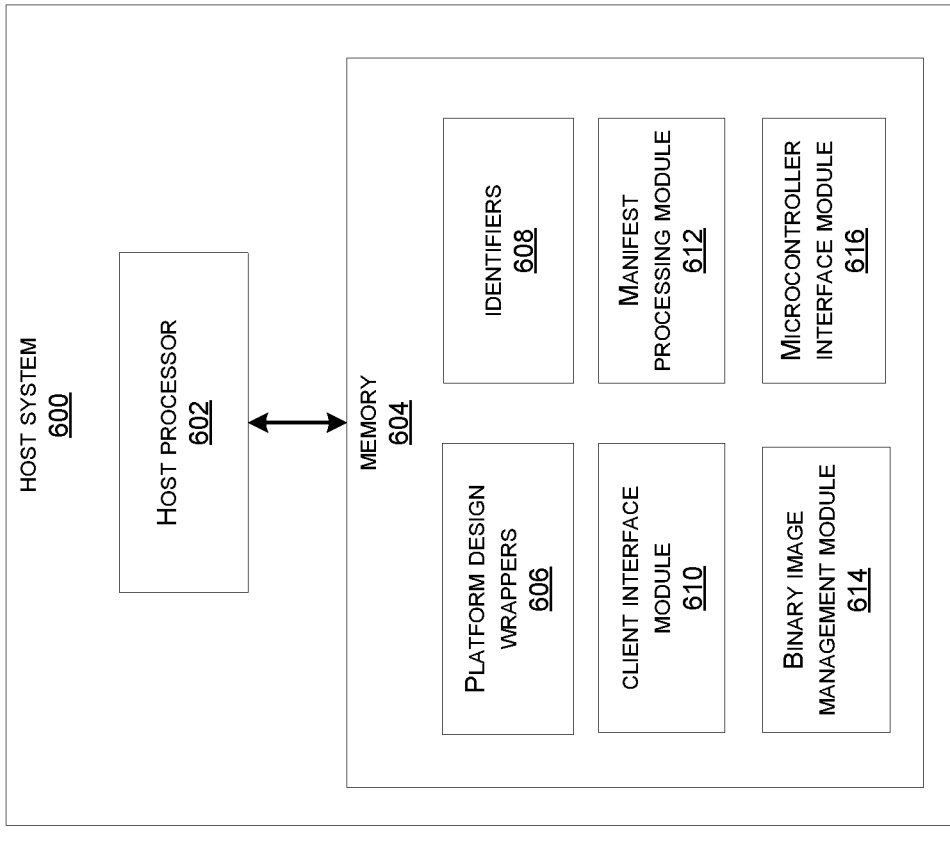
FIG. 6 illustrates an example computing system configured to execute program code for a developer tool kit for a cloud-based FPGA system, according to some embodiments.

FIG. 6 illustrates an example host system 600 configured to execute program code for a developer tool kit for a cloud-based FPGA system, according to some embodiments. As an example, the cloud-based FPGA system may include the IC devices 108a-108n in FIG. 1.

The host system 600 may include a host processor 602 coupled to memory 604. The host system 600 can be part of a compute instance in a cloud-based server. The memory 604 may be configured to store program code for the developer tool kit that can be executed by the host processor 602. The memory 604 may also store platform design wrappers 606, identifiers 608 to access IC designs, a client interface module 610, a manifest processing module 612, a binary image management module 614, and a microcontroller interface module 616.

The platform design wrappers 606 may include information associated with a plurality of platform design wrappers that can be provided to clients for selection. Each of the platform design wrappers may include information about a specific platform logic design, and different C2C interface selections. For example, a full platform design wrapper may include information about the full platform logic design, and an option to select zero, one, or two adjacent C2C interfaces for connecting to the other FPGA devices. A mid-platform design wrapper may include information about the mid-platform logic design, and an option to select zero, one, or two adjacent C2C interfaces for connecting to the other FPGA devices. Similarly, a minimal logic design wrapper may include information about the minimal platform logic design, and an option to select zero, one, or two adjacent C2C interfaces for connecting to the other FPGA devices. For example, the information about each platform logic design may include inputs, outputs, floorplan details, and any timing constraints which can help simplify the design integration with the custom logic.

The identifiers 608 may include unique group identifiers and FPGA device identifiers associated with different clients' custom designs. A unique group identifier and respective FPGA device identifiers can be assigned to each custom design, which can be used by the respective client to configure or re-configure the FPGA devices, and access those FPGA devices for execution of the client applications.

The client interface module 610 may be used for communicating with the client device using any suitable interface (e.g., an application programming interface (API)). As an example, the client interface module 610 can be used to provide the client with the platform design wrappers 606 for selecting the platform logic designs and C2C interfaces for each logic partition of the IC design. The client interface module 610 can also be used to receive a set of logic partitions of the IC design and a manifest from the client. The manifest may comprise information indicating a number of FPGA devices being used to emulate the IC design, and, for each of the FPGA devices, information indicating a logic design wrapper selected for a logic partition to be implemented in that FPGA device. The client interface module 610 can also be used to exchange the group identifier and the corresponding FPGA device identifiers with the client. The client interface module 610 can also be used to receive a request from the client comprising the group identifier to deploy the IC design on the FPGA devices.

The manifest processing module 612 may be used to process the information in the manifest received from the client using the client interface module 610. The processed information can be used to generate the set of binary images for the client. For example, the processed information may include information related to a logic partition and a platform logic design selected for each FPGA device.

The binary image management module 614 may be used to generate the set of binary images to emulate the IC design for the client, store the set of binary images in a memory, and retrieve the set of binary images from the memory. The set of binary images can be generated based on the processed information by the manifest processing module 612 and the set of logic partitions of the IC design. The set of binary images can be stored in a memory that is also accessible by the corresponding microcontrollers. This memory can be part of the memory 604 or can be an independent memory device on the card. The client can also access the set of binary images for the IC design using the associated group identifier for deploying the IC design on the FPGA devices. The binary image management module 614 can also be used to re-generate the set of binary images when the IC design is changed by the client to fix bugs or add features.

The microcontroller interface module 616 can be used to communicate with each microcontroller in the FPGA system. In some implementations, the microcontroller interface module 616 can be used to initiate programming of the FPGA devices via the corresponding microcontrollers with the respective set of FPGA images stored in the memory. For example, the microcontroller interface module 616 can initiate programming of a first FPGA device (e.g., IC device 108a) with a first binary image via the first microcontroller 110a, . . . , and an Nth FPGA device (e.g., IC device 108n) with an Nth binary image via the Nth microcontroller 110n, etc.

In some embodiments, the host processor 602 can be the same as the host processor 104 in FIG. 1, and the memory 604 can be part of the memory 106. For example, once the FPGA system has been configured with the set of FPGA images, a client application running on the host processor 602 can interact with the IC design programmed in the IC devices 108a-108n. In some embodiments, some of the functionalities implemented on the host system 600 may be implemented on another host system. For example, in some implementations, the set of binary images may be generated on one host device and can be retrieved on another host device using the group identifier.

Figure 7:
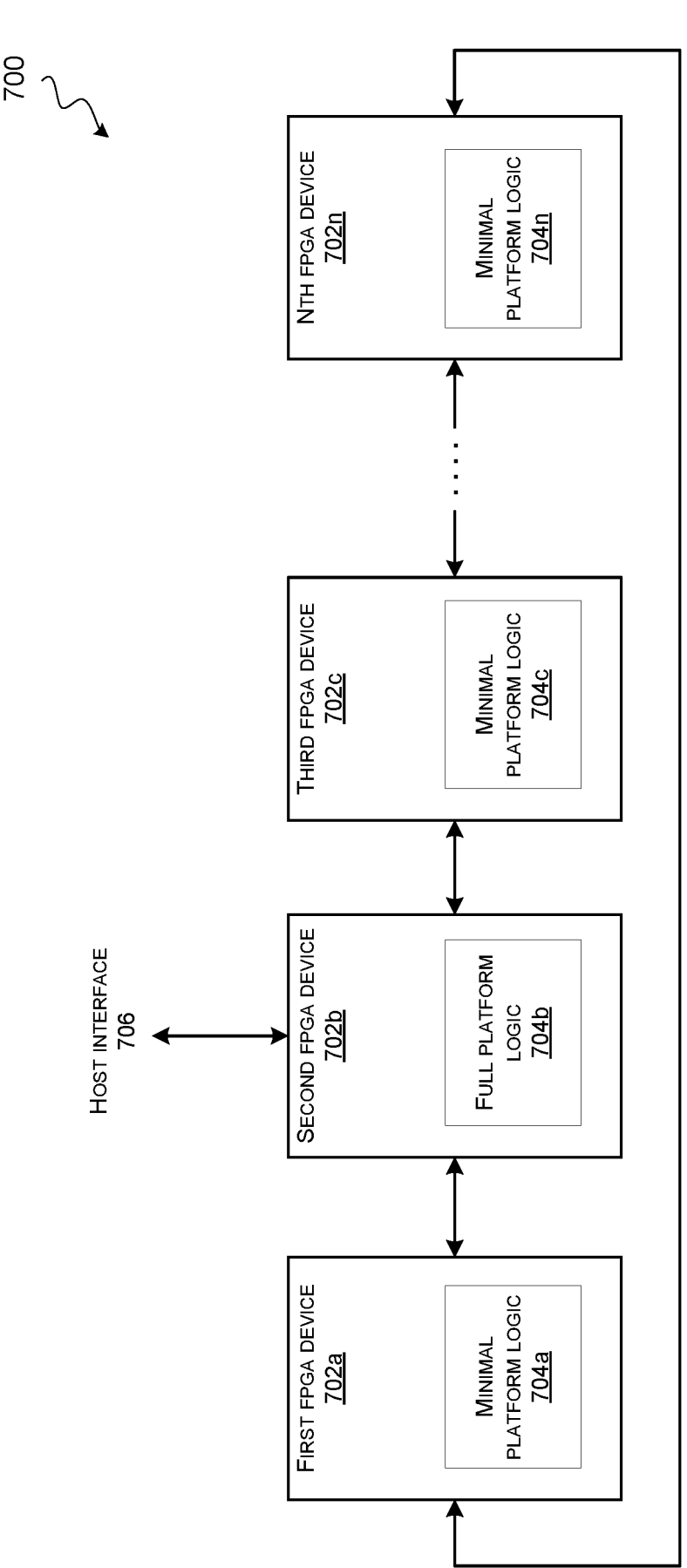
FIG. 7 illustrates an example FPGA system comprising FPGA devices configured to operate in a ring topology according to some embodiments.

FIG. 7 illustrates an example FPGA system 700 comprising FPGA devices configured to operate in a ring topology according to some embodiments.

The FPGA system 700 may include N FPGA devices comprising a first FPGA device 702a, a second FPGA device 702b, a third FPGA device 702c, and an Nth FPGA device 702n. The first FPGA device 702a may include minimal platform logic 704a, the second FPGA device 702b may include full platform logic 704b, the third FPGA device 702c may include minimal platform logic 704c, and the Nth FPGA device 702n may include minimal platform logic 704n. The full platform logic 704b may be an example of the full platform logic 200, and the minimal platform logic 704a, 704c, and 704n may be examples of the minimal platform logic 400. The second FPGA device 702b may be configured to communicate with the host system 102 using a host interface 706. The host interface 706 may be one of the bus interfaces 116a-116n.

Each of the N FPGA devices 704a-704n may also include respective user programmable logic that is not shown in FIG. 7 for ease of illustration. The N FPGA devices may be connected to operate in a ring topology using respective C2C links. For example, each of the N FPGA devices 704a-704n may include two C2C links, similar to the C2C links 510 and 512, to communicate with their adjacent FPGA devices. As shown in FIG. 7, the first FPGA device 702a may be coupled to the second FPGA device 702b and the Nth FPGA device 702n using respective C2C links. The second FPGA device 702b may be coupled to the first FPGA device 702a and the third FPGA device 702c using respective C2C links. The third FPGA device 702c may be coupled to the second FPGA devices 702b and a fourth FPGA device (not shown) using respective C2C links. The Nth FPGA device 702n may be coupled to the N−1st FPGA device (not shown) and the first FPGA device 702a using respective C2C links.

The example FPGA system 700 can be used when the client application requires large amounts of processing and local storage resources from the FPGA devices, but does not need to exchange a lot of data with the host system 102. In such cases, only one of the FPGA devices can include the full platform logic to communicate with the host system 102, and the other FPGA devices may include the minimal platform logic to maximize the space for the user programmable logic and the FPGA resources. One such application can be related to a neural network model that may receive input data from the second FPGA device 702b having the host interface 706. The ring topology lets the data flow through the pipelined network spread across multiple cards. The data flow may traverse the ring topology several times to generate the final result. The final result may get pushed back to the second FPGA device 702*b* for returning to the host system 102 via the host interface 706. For example, having the minimal platform logic for all the FPGA devices except one FPGA device (e.g., 702*b*) in the FPGA system 700 can provide maximum space for the user programmable logic and resources that can allow the weights of the neurons to be calculated, updated, and stored locally on the corresponding FPGA cards.

Figure 8:
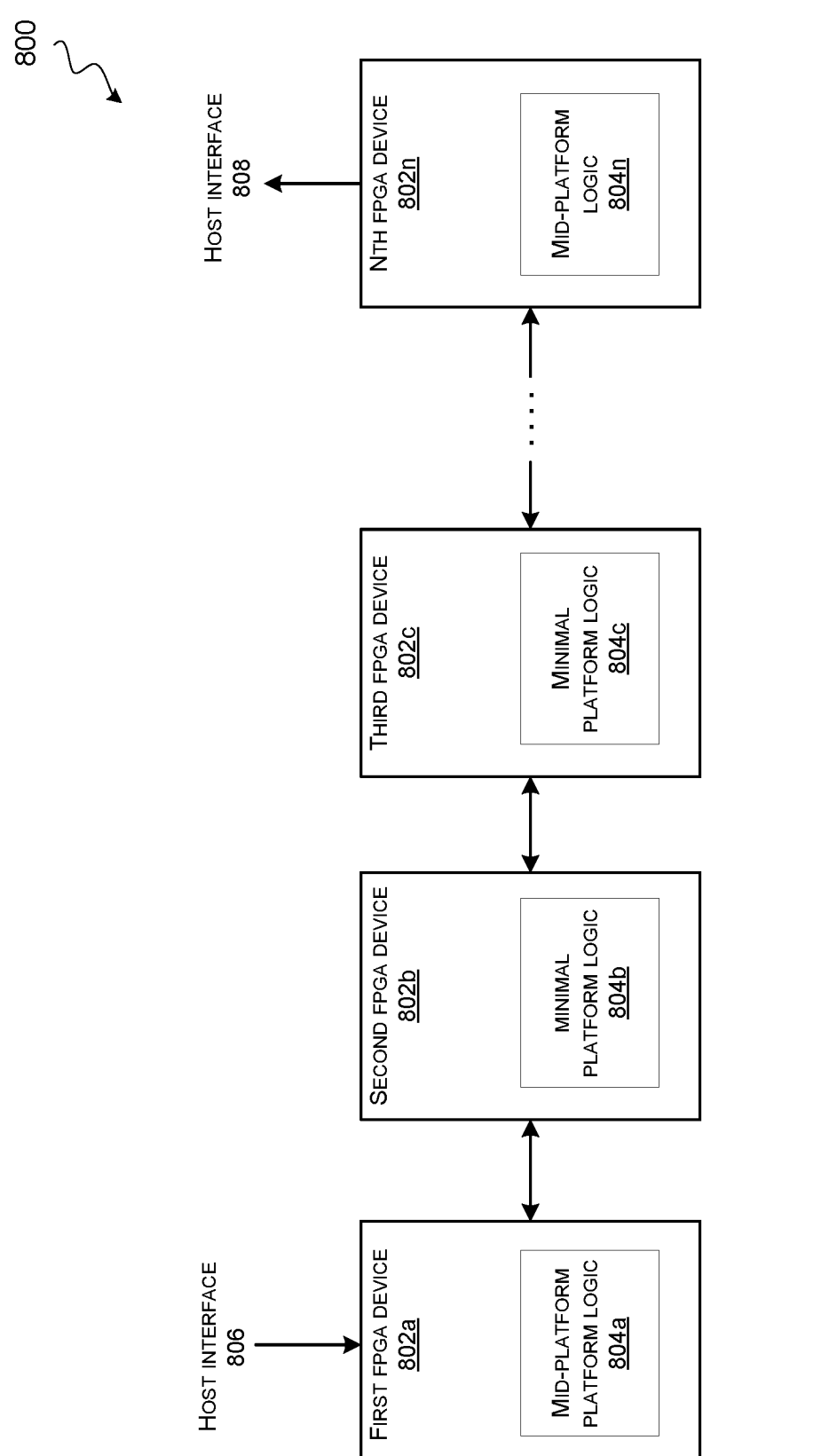
FIG. 8 illustrates an example FPGA system comprising FPGA devices configured to operate in a chain topology according to some embodiments.

FIG. 8 illustrates an example FPGA system 800 comprising FPGA devices configured to operate in a chain topology according to some embodiments. It should be noted that although the FPGA devices are configured in a chain topology to implement the client's custom IC design, the FPGA devices can be physically coupled in a ring topology. The chain topology can be achieved by disabling one of the available C2C interfaces in each of the first and last FPGA devices in the chain topology.

In some cases, customer design may demand separate cards to function as a data source and a data sink, and may include the DMA functionality within the IC design. For example, the IC design may include pipeline logic, and each pipeline stage can be mapped to an FPGA card that processes the data and forwards it to the next FPGA card. In such cases, the mid-platform logic can be used at the beginning and at the end of the chain implementing the FPGA system, and the minimal platform logic can be used for the remaining FPGA devices in the chain. The FPGA devices with the mid-platform logic can be used to communicate with the host system 102 using respective host interfaces.

As shown in FIG. 8, the FPGA system 800 may include N FPGA devices comprising a first FPGA device 802*a*, a second FPGA device 802*b*, a third FPGA device 802*c*, and an Nth FPGA device 802*n*. The first FPGA device 802*a* may include mid-platform logic 804*a*, the second FPGA device 802*b* may include minimal platform logic 804*b*, the third FPGA device 802*c* may include minimal platform logic 804*c*, and the Nth FPGA device 802*n* may include mid-platform logic 804*n*. The mid-platform logic 804*a* and 804*n* may be examples of the mid-platform logic 300, and the minimal platform logic 804*b* and 804*c* may be examples of the minimal platform logic 400. The first FPGA device 802*a* may be configured to communicate with the host system 102 as a data source using a host interface 806. The Nth FPGA device 802*n* may be configured to communicate with the host system 102 as a data sink using a host interface 808. The host interfaces 806 and 808 may be one of the bus interfaces 116*a*-116*n*.

Each of the N FPGA devices 804*a*-804*n* may also include respective user programmable logic that is not shown in FIG. 8 for ease of illustration. The N FPGA devices may be connected to operate in a chain topology using respective C2C links. For example, each of the first FPGA device 802*a* and the Nth FPGA device 802*n* may include only one C2C link, and the remaining FPGA devices may include two C2C links to communicate with their adjacent FPGA devices. As shown in FIG. 8, the first FPGA device 802*a* may only be coupled to the second FPGA device 802*b* using a single C2C link that may be similar to the C2C link 512. The second FPGA device 802*b* may be coupled to the first FPGA device 802*a* and the third FPGA device 802*c* using respective C2C links, similar to the C2C links 510 and 512. The third FPGA device 802*c* may be coupled to the second FPGA devices 802*b* and a fourth FPGA device (not shown) using respective C2C links. The Nth FPGA device 802*n* may only be coupled to the N-1 st FPGA device (not shown) using a single C2C link that may be similar to the C2C link 510.

Note that in some implementations, the customer design may not include the DMA logic. In such cases, the client may select full platform logic instead of the mid-platform logic for the first FPGA device 802*a* and the Nth FPGA device 802*n*, which will include the DMA logic. In some cases, a plurality of chain topologies can be configured in the FPGA system 800. For example, with N equal to 8, two or more different chain topologies may exist in the FPGA system 800 (e.g., two chains of 4 FPGA devices), which may be associated with different clients or different IC designs, and may operate independently. Other topologies can also be achieved by selectively enable/disabling the C2C interfaces, and determining which FPGA device is programmed with a platform logic design having a host interface.

Figure 9:
FIG. 9 illustrates an example flow chart for a method to program a set of FPGA devices in accordance with some embodiments.
Figure 9:
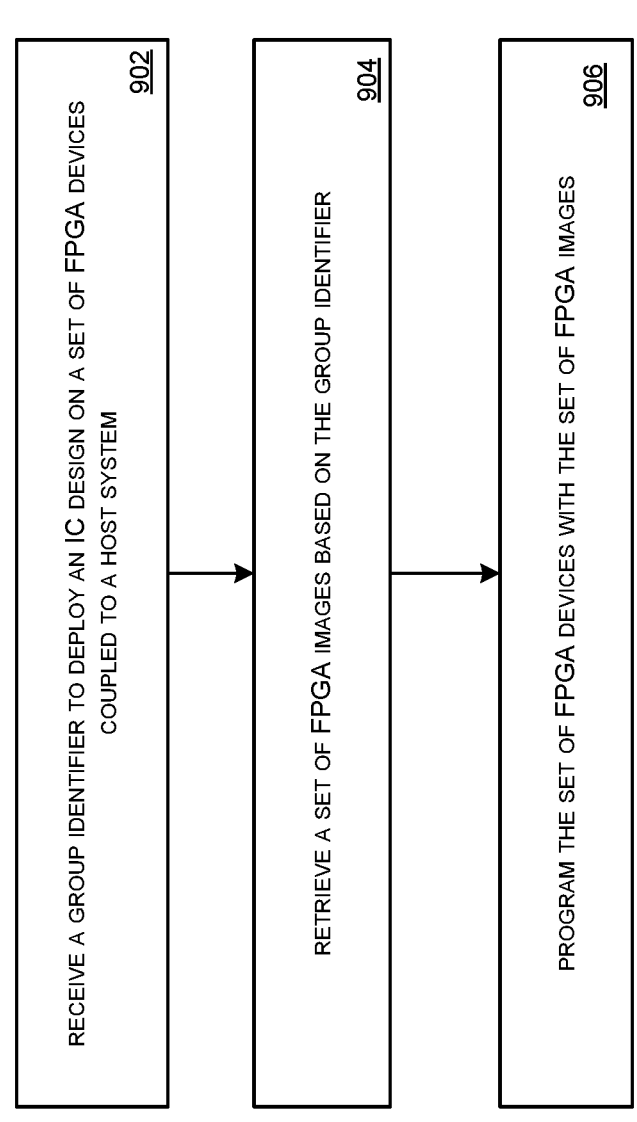

FIG. 9 illustrates an example flow chart 900 for a method to program a set of FPGA devices in accordance with some embodiments. The method may be executed by a host system. For example, the host system can be the host system 102 or the host system 600. The set of FPGA devices may include N IC devices 108*a*-108*n*, or a set of IC devices from the N IC devices 108*a*-108*n*. For example, N can be 4, and the number of FPGA devices in the set of FPGA devices may include 4. The set of FPGA devices may be configured to operate in a chain topology, ring topology, or other topology.

In step 902, the method includes receiving a group identifier to deploy an IC design on a set of FPGA devices coupled to a host system. For example, the set of FPGA devices may be the FPGA devices 802*a*, 802*b*, 802*c*, and 802*n*, which can be an example of the IC devices 108*a*-108*n*. The IC design may belong to a customer or client, which may provide the group identifier using a cloud-based developer tool kit to deploy the IC design associated with the group identifier on the FPGA devices 802*a*-802*n*. As discussed with reference to FIG. 6, the program code for the developer tool kit may be stored in the memory 604, which may be executed by the host processor 602. As an example, the client may request to deploy the IC design on the FPGA devices 802*a*-802*n* using the developer tool kit. The client request may be received by the client interface module 610.

In step 904, the method includes retrieving a set of FPGA images based on the group identifier. The binary image management module 614 may retrieve the set of FPGA images from the memory based on the group identifier. The set of FPGA images may have been generated by the binary image management module 614 based on the set of logic partitions of the IC design and the manifest received via the developer tool kit. For example, the client may have split the IC design into 4 logic partitions for mapping to the FPGA devices 802*a*-802*n*.

In step 906, the method includes programming the set of FPGA devices with the set of FPGA images. The microcontroller interface module 616 may initiate programming of the FPGA devices 802*a*-802*n* with the set of FPGA images via the corresponding microcontroller. For example, the first FPGA device 802*a* may be programmed with a first FPGA image via a first microcontroller, the second FPGA device 802*b* may be programmed with a second FPGA image via a second microcontroller, the third FPGA device 802*c* may be programmed with a third FPGA image via a third microcontroller, and the Nth FPGA device 802*n* may be programmed with a fourth FPGA image via a fourth microcontroller. The first, second, third, and fourth microcontrollers can be examples of the microcontrollers 110*a*-110*n*.

Each of the FPGA devices 802a-802n may be programmed with platform logic corresponding to a platform logic design that has been selected from a plurality of platform logic designs. The plurality of platform logic designs may be provided as the platform design wrappers to the client via the client interface module 610. For example, the client may have selected the mid-platform logic design for programming the FPGA devices 802a and 802n, and the minimal platform logic design for programming the FPGA devices 802c and 802d. The client may have provided the mapping of the platform logic design and C2C interfaces for each of the FPFGA devices to the host system in the manifest. Each of the selected platform logic designs may include the management control logic block for communicating with the corresponding microcontroller, and the mid-platform logic designs selected for the FPGA device 802a and 802n may include a host interface to enable a client application running on the host system 102 or 600 to interact with the custom IC design.

Thus, the embodiments can provide hardware and software solutions for an elastic FPGA system in a multi-card server that can allow optimal use of the FPGA resources by providing an option to the client to mix and match different platform logic designs based upon the connection topology. This flexible architecture can offer more FPGA space and resources to the clients as compared to traditional architectures with fixed platform designs, which can make the timing closures and design routing much easier for the custom design, and improve the customer experience.

Figure 10:
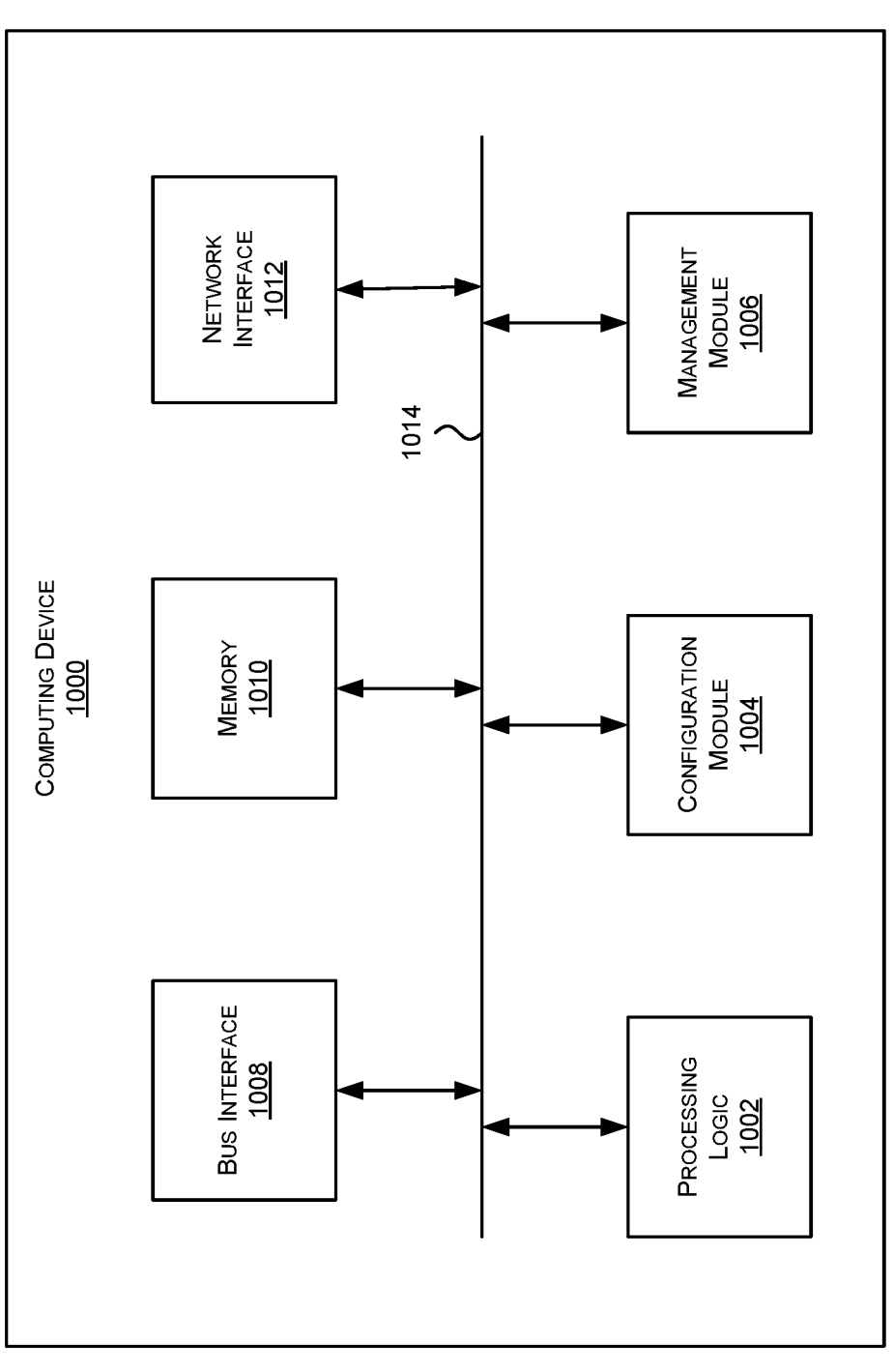
FIG. 10 illustrates an example of a computing device, according to certain aspects of the disclosure.

FIG. 10 illustrates an example of a computing device 1000. Functionality and/or several components of the computing device 1000 may be used without limitation with other embodiments disclosed elsewhere in this disclosure, without limitations. For example, the computing device 100 can be an example of the host system 102, and/or the host system 600. A computing device 1000 may facilitate processing of packets and/or forwarding of packets from the computing device 1000 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 1000 may be the recipient and/or generator of packets. In some implementations, the computing device 1000 may modify the contents of the packet before forwarding the packet to another device. The computing device 1000 may be a peripheral device coupled to another computer device, a switch, a router or any other suitable device enabled for receiving and forwarding packets.

In one example, the computing device 1000 may include processing logic 1002, a configuration module 1004, a management module 1006, a bus interface module 1008, memory 1010, and a network interface module 1012. These modules may be hardware modules, software modules, or a combination of hardware and software. In certain instances, modules may be interchangeably used with components or engines, without deviating from the scope of the disclosure. The computing device 1000 may include additional modules, which are not illustrated here. In some implementations, the computing device 1000 may include fewer modules. In some implementations, one or more of the modules may be combined into one module. One or more of the modules may be in communication with each other over a communication channel 1014. The communication channel 1014 may include one or more busses, meshes, matrices, fabrics, a combination of these communication channels, or some other suitable communication channel.

The processing logic 1002 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1002 may include processors developed by ARMR, MIPSR, AMDR, Intel R, QualcommR, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1002 may be stored on a computer-readable storage medium, for example, in the form of a computer program. The computer-readable storage medium may be non-transitory. In some cases, the computer-readable medium may be part of the memory 1010.

The memory 1010 may include either volatile or non-volatile, or both volatile and non-volatile types of memory. The memory 1010 may, for example, include random access memory (RAM), read only memory (ROM), Electrically Erasable Programmable Read-Only Memory (EEPROM), flash memory, and/or some other suitable storage media. In some cases, some or all of the memory 1010 may be internal to the computing device 1000, while in other cases some or all of the memory may be external to the computing device 1000. The memory 1010 may store an operating system comprising executable instructions that, when executed by the processing logic 1002, provides the execution environment for executing instructions providing networking functionality for the computing device 1000. The memory may also store and maintain several data structures and routing tables for facilitating the functionality of the computing device 1000.

In some implementations, the configuration module 1004 may include one or more configuration registers. Configuration registers may control the operations of the computing device 1000. In some implementations, one or more bits in the configuration register can represent certain capabilities of the computing device 1000. Configuration registers may be programmed by instructions executing in the processing logic 1002, and/or by an external entity, such as a host device, an operating system executing on a host device, and/or a remote device. The configuration module 1004 may further include hardware and/or software that control the operations of the computing device 1000.

In some implementations, the management module 1006 may be configured to manage different components of the computing device 1000. In some cases, the management module 1006 may configure one or more bits in one or more configuration registers at power up, to enable or disable certain capabilities of the computing device 1000. In certain implementations, the management module 1006 may use processing resources from the processing logic 1002. In other implementations, the management module 1006 may have processing logic similar to the processing logic 1002, but segmented away or implemented on a different power plane than the processing logic 1002.

The bus interface module 1008 may enable communication with external entities, such as a host device and/or other components in a computing system, over an external communication medium. The bus interface module 1008 may include a physical interface for connecting to a cable, socket, port, or other connection to the external communication medium. The bus interface module 1008 may further include hardware and/or software to manage incoming and outgoing transactions. The bus interface module 1008 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1008 may include the physical layer for any of these bus protocols, including a connector, power management, and error handling, among other things. In some implementations, the computing device 1000 may include multiple bus interface modules for communicating with multiple external entities. These multiple bus interface modules may implement the same local bus protocol, different local bus protocols, or a combination of the same and different bus protocols.

The network interface module 1012 may include hardware and/or software for communicating with a network. This network interface module 1012 may, for example, include physical connectors or physical ports for wired connection to a network, and/or antennas for wireless communication to a network. The network interface module 1012 may further include hardware and/or software configured to implement a network protocol stack. The network interface module 1012 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1000 may include multiple network interface modules, each configured to communicate with a different network. For example, in these implementations, the computing device 1000 may include a network interface module for communicating with a wired Ethernet network, a wireless 802.11 network, a cellular network, an Infiniband network, etc.

The various components and modules of the computing device 1000, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 10, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit device comprising:
a user programmable logic partition; and
a platform logic partition programmed with a first platform logic design selected from a plurality of platform logic designs having varying numbers of components,
wherein each of the plurality of platform logic designs has a management control logic block coupled to a microcontroller to implement device management functions including programming of the integrated circuit device,
wherein at least one of the platform logic designs includes a host interface logic block implementing a host interface to communicate with a host system, and
wherein the platform logic partition is reprogrammed from the first platform logic design to a second platform logic design to allocate logic resources to the user programmable logic partition.

2. The integrated circuit device of claim 1, wherein the plurality of platform logic designs includes a platform logic design having the host interface logic block, a direct memory access (DMA) logic block to perform DMA access with the host system, an isolation logic block to isolate the host interface during programming of the user programmable logic partition, and the management control logic block.

3. The integrated circuit device of claim 1, wherein the plurality of platform logic designs includes a platform logic design having the host interface logic block, an isolation logic block to isolate the host interface during programming of the user programmable logic partition, and the management control logic block.

4. The integrated circuit device of claim 1, wherein the plurality of platform logic designs includes a platform logic design having the management control logic block without the host interface logic block.

5. The integrated circuit device of claim 1, wherein the integrated circuit device is a field programmable gate array (FPGA) device, and the integrated circuit device is programmed with a first FPGA-to-FPGA interface to communicate with a first adjacent FPGA device.

6. The integrated circuit device of claim 5, wherein the integrated circuit device is programmed with a second FPGA-to-FPGA interface to communicate with a second adjacent FPGA device.

7. The integrated circuit device of claim 6, wherein the platform logic partition is programmed with the host interface to communicate with the host system, and wherein the integrated circuit device is configured to provide data received on the host interface from the host system to a series of FPGA devices via the first FPGA-to-FPGA interface, and to provide data received on the second FPGA-to-FPGA interface from the series of FPGA devices to the host system via the host interface.

8. The integrated circuit device of claim 7, wherein each of the FPGA devices in the series of FPGA devices is programmed with two FPGA-to-FPGA interfaces.

9. The integrated circuit device of claim 7, wherein the platform logic partition in each of the FPGA devices in the series of FPGA devices, except for the integrated circuit device, is programmed with a platform logic design that does not have a host interface.

10. The integrated circuit device of claim 6, wherein the platform logic partition is programmed with a platform logic design that does not have a host interface, and wherein the integrated circuit device receives data from the host system via the first adjacent FPGA device, and provides data to the host system via the second adjacent FPGA device.

11. The integrated circuit device of claim 5, wherein the platform logic partition is programmed with the host interface to communicate with the host system as a data source to provide data from the host system to a chain of FPGA devices coupled to the first FPGA-to-FPGA interface.

12. The integrated circuit device of claim 5, wherein the platform logic partition is programmed with the host interface to communicate with the host system as a data sink to provide data to the host system from a chain of FPGA devices coupled to the first FPGA-to-FPGA interface.

13. The integrated circuit device of claim 1, wherein the integrated circuit device and the microcontroller are implemented on a field programmable gate array (FPGA) card.

14. An integrated circuit device, comprising:
a user programmable logic partition; and
a platform logic partition programmed with platform logic selected from a plurality of platform logic designs having varying numbers of components,
wherein each of the plurality of platform logic designs has a management control logic block coupled to a microcontroller to implement device management functions including programming of the integrated circuit device,
wherein at least one of the platform logic designs includes a host interface logic block implementing a host interface to communicate with a host system, and
wherein the integrated circuit device and the microcontroller are implemented on a field programmable gate array (FPGA) card that is part of a multi-card FPGA system.

15. The integrated circuit device of claim 14, wherein each FPGA card in the multi-card FPGA system is physically coupled to a first adjacent FPGA card on a first card-to-card interface and to a second adjacent FPGA card on a second card-to-card interface.

16. The integrated circuit device of claim 15, wherein the multi-card FPGA system implements a chain topology by disabling a card-to-card interface in each of a first FPGA card and a last FPGA card of the chain topology.

17. The integrated circuit device of claim 16, wherein the multi-card FPGA system implements multiple chain topologies.

18. The integrated circuit device of claim 14, wherein the multi-card FPGA system is implemented in a cloud-based server coupled to the host system.

19. The integrated circuit device of claim 18, wherein the host system includes a client interface to communicate with a client device, and wherein a selection of which of the plurality of platform logic designs to program in the platform logic partition is received via the client interface.

20. A method comprising:
programming an integrated circuit device having a user programmable logic partition and a platform logic partition, wherein the platform logic partition is programmed with a first platform logic design selected from a plurality of platform logic designs having varying numbers of components; and reprogramming the platform logic partition of the integrated circuit device from the first platform logic design to a second platform logic design to allocate logic resources to the user programmable logic partition, wherein each of the plurality of platform logic designs has a management control logic block coupled to a microcontroller to implement device management functions including programming of the integrated circuit device, and wherein at least one of the platform logic designs includes a host interface logic block implementing a host interface to communicate with a host system.

* * * * *